United States Patent
Cho

(10) Patent No.: US 9,082,704 B2
(45) Date of Patent: Jul. 14, 2015

(54) SEMICONDUCTOR MEMORY DEVICE AND MANUFACTURING METHOD THEREFOR

(75) Inventor: Shien Cho, Kanagawa (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 221 days.

(21) Appl. No.: 12/385,210

(22) Filed: Apr. 1, 2009

(65) Prior Publication Data

US 2009/0250744 A1   Oct. 8, 2009

(30) Foreign Application Priority Data

Apr. 2, 2008   (JP) .................... 2008-096372

(51) Int. Cl.
*H01L 29/792*   (2006.01)
*H01L 21/28*   (2006.01)
(Continued)

(52) U.S. Cl.
CPC ...... *H01L 21/28282* (2013.01); *H01L 21/0214* (2013.01); *H01L 21/02326* (2013.01); *H01L 21/28273* (2013.01); *H01L 21/3115* (2013.01); *H01L 21/3144* (2013.01); *H01L 21/76832* (2013.01); *H01L 29/4234* (2013.01); *H01L 29/792* (2013.01)

(58) Field of Classification Search
CPC .......... H01L 21/28282; H01L 21/28273; H01L 21/76832; H01L 21/3144; H01L 29/792; H01L 29/4234; H01L 21/02326; H01L 21/3115; H01L 21/0214
USPC .......... 257/29–32, 324, 317, E29.3, E29.309; 438/763
See application file for complete search history.

(56) References Cited

U.S. PATENT DOCUMENTS 5,597,747 A * 1/1997 Chen ................................ 438/30
5,691,937 A * 11/1997 Ohta ........................ 365/185.01
(Continued)

FOREIGN PATENT DOCUMENTS

JP    61-154171 A    7/1986
JP    9-45799    2/1997
(Continued)

OTHER PUBLICATIONS

Jonak-Auer et al. ("Determination of the hydrogen concentration of silicon nitride layers by Fourier transform infrared spectroscopy" Infrared Physics & Technology 38 (1997) 223-226).*

(Continued)

*Primary Examiner* — Marcos D. Pizarro
*Assistant Examiner* — Sue Tang
(74) *Attorney, Agent, or Firm* — McGinn IP Law Group, PLLC

(57) ABSTRACT

A semiconductor memory device has a cover film (5), between a memory cell (gate electrode 4, and source and drain regions 2a and 2b) and an interlayer insulating film (6), the cover film covering the memory cell, wherein the cover film (5) has a hydrogen storage film (5a) that is a coating film on a surface of a silicon nitride film (5b), and in addition, has a hydrogen storage film (5c) on a bottom surface of the silicon nitride film (5b). The hydrogen storage films (5a and 5b) are silicon nitride oxide films that include $Si_2N_2O$. By suppressing diffusion of hydrogen atoms to a memory cell from an interlayer insulating film, reliability of operation of the memory cell is improved.

17 Claims, 2 Drawing Sheets

(51) Int. Cl.
*H01L 21/02* (2006.01)
*H01L 21/3115* (2006.01)
*H01L 21/314* (2006.01)
*H01L 21/768* (2006.01)
*H01L 29/423* (2006.01)

(56) References Cited

U.S. PATENT DOCUMENTS

| | | | | |
|---|---|---|---|---|
| 5,729,035 | A * | 3/1998 | Anma | 257/324 |
| 6,747,311 | B2 * | 6/2004 | Goda et al. | 257/326 |
| 6,828,624 | B1 | 12/2004 | Goda et al. | |
| 6,917,072 | B2 * | 7/2005 | Noguchi et al. | 257/324 |
| 2004/0053468 | A1 * | 3/2004 | Dong et al. | 438/261 |
| 2005/0181559 | A1 * | 8/2005 | Natori et al. | 438/253 |
| 2005/0221565 | A1 * | 10/2005 | Tamura et al. | 438/295 |
| 2009/0008690 | A1 * | 1/2009 | Shiba et al. | 257/298 |
| 2009/0127589 | A1 * | 5/2009 | Rothberg et al. | 257/253 |

FOREIGN PATENT DOCUMENTS

| | | |
|---|---|---|
| JP | 11-233511 | 8/1999 |
| JP | 2000-311992 | 11/2000 |
| JP | 2004-47606 A1 | 2/2004 |

OTHER PUBLICATIONS

Wong et al. ("Minimizing hydrogen content in silicon oxynitride by thermal oxidation of silicon-rich silicon nitride" Microelectronics Reliability 46 (2006) 2056-2061.*
"Determination of the hydrogen concentration of silicon nitride layers by Fourier transform infrared spectroscopy" by Jonak-Auer et al. Infrared Physics & Technology 38 (1997) 223-226.*
"Minimizing hydrogen content in silicon oxynitride by thermal oxidation of silicon-rich silicon nitride" by Wong et al. Microelectronics Reliability 46 (2006) 2056-2061.*
Torrison et al. ("Stoichiometric and non-stoichiometric films in the Si—O—N system: mechanical, electrical, and dielectric properties" Material Science & Engineering B97 (2003) 54-58).*
"Impact of passivation film deposition and post-annealing on the reliability of flash memories" Susumu Shuto, et al. International Reliability Physics Symposium (IRPS), IEEE, pp. 17-24, 1997.
"A hydrogen storage layer on the surface of silicon nitride films" Ziyuan Liu, et al. Applied Physics Letters 92, 192115 (pp. 192115-1 to 192115-3) (2008).
Japanese Office Action dated Mar. 12, 2013, with partial English translation.
Japanese Office Action dated Jul. 16, 2013 with English translation thereof.

* cited by examiner

US 9,082,704 B2

SEMICONDUCTOR MEMORY DEVICE AND MANUFACTURING METHOD THEREFOR

REFERENCE TO RELATED APPLICATION

This application is based upon and claims the benefit of the priority of Japanese patent application No. 2008-096372, filed on Apr. 2, 2008, the disclosure of which is incorporated herein in its entirety by reference thereto.

TECHNICAL FIELD

The present invention relates to a semiconductor memory device having a nonvolatile memory cell, and a manufacturing method therefor, and in particular, to a semiconductor memory device having a cover film covering the whole memory cell, between the memory cell and an interlayer insulating film.

BACKGROUND

In semiconductor memory devices having a conventional nonvolatile memory cell, there are cases where a whole memory cell is covered by a cover film between the memory cell and an interlayer insulating film. Covering the whole memory cell by the cover film is for purposes of preventing spread of contamination to a device, and protecting the device from moisture or mechanical stress.

However, it is known that diffusion of hydrogen to a gate insulating film of a transistor influences reliability of the device (Non-Patent Documents 1 and 2). Hydrogen atoms are generally included in the interlayer insulating film, and the hydrogen atoms in the interlayer insulating film diffuse to the gate insulating film (tunnel insulating film), so that a threshold voltage Vt of the transistor varies, due to variation of hydrogen concentration in the gate insulating film. By the cover film lying between the memory cell and the interlayer insulating film, it is possible to suppress diffusion of the hydrogen atoms to the gate insulating film. The following technology is disclosed with regard to this type of cover film.

In Patent Document 1, a first layer in contact with a device surface is formed of silicon oxy-nitride deposited by a plasma-enhanced chemical vapor deposition (PECVD) process using silane as a reactant gas; a second layer is formed of silicon oxide provided by a chemical vapor deposition process using tetraethyl orthosilicate (TEOS) as a reactant gas; and a third layer is formed of silicon oxy-nitride deposited by a plasma-enhanced chemical vapor deposition (PECVD) process using silane as a reactant gas. It is disclosed that an advantage is obtained by using the silicon oxy-nitride is that concentration of free hydrogen inside the film is low. In addition, the silicon oxide of the second layer is disclosed to improve conformity. Furthermore, the silicon oxy-nitride of the third layer is disclosed to be a physical barrier against mechanical stress.

Patent Document 2 discloses a formulation having a surface oxide film in which, as a cover film, a first insulating film formed of a silicon nitride film (SiN) etc., is covered via a post-oxidized film on a device and a surface of the first insulating film has a surface oxide film formed by oxidizing. The first insulating film in which the surface oxide film is formed has a concentration gradient such that hydrogen concentration gradually becomes higher from a surface side thereof. In addition, it is disclosed that in the first insulating film (silicon nitride film) the hydrogen concentration in the film is less than or equal to approximately $1.6 \times 10^{21}$ atom/cm$^3$.

Patent Document 3 discloses a formulation in which, as a cover film, a post-oxidized film is formed by thermal oxidation on a device.

[Patent Document 1]
   JP Patent Kokai Publication No. JP-A-11-233511
[Patent Document 2]
   JP Patent Kokai Publication No. JP-P2000-311992A
[Patent Document 3]
   JP Patent Kokai Publication No. JP-A-09-45799
[Non-Patent Document 1]
   Ziyuan Liu and 7 others, Influence of Hydrogen Permeability of Liner Nitride Film on Program/Erase Endurance of Split-Gate Type Flash EEPROMs, International Reliability Physics Symposium (IRPS), US, IEEE, 2007, pp. 190-196.
[Non-Patent Document 2]
   Susumu Shuto, and 4 others, Impact of Passivation Film Deposition and Post-Annealing on the Reliability of Flash Memories, International Reliability Physics Symposium (IRPS), US, IEEE, 1997, pp. 17-24.

SUMMARY

The disclosures of the above Patent Documents 1 to 3 and Non-Patent Documents 1 and 2 are incorporated herein by reference thereto.

An analysis of a related art by the present invention will be given below.

With respect to a cover film described in Patent Document 1, although the concentration of free hydrogen inside the silicon oxy-nitride film is low, if the temperature rises to a high value of 700 degrees or more, it is not possible to completely block penetration (diffusion) of the hydrogen atoms from the interlayer insulating film, and there is a risk that the hydrogen atoms that penetrate the cover film will diffuse to the gate insulating film (tunnel insulating film), an electron trap amount in the gate insulating film will vary, and the threshold voltage Vt of the transistor will vary.

With respect to the cover film described in Patent Document 2, the first insulating film formed of the surface oxide film has a concentration gradient such that the hydrogen concentration gradually becomes higher from a surface side thereof, but it is not possible to completely block penetration of the hydrogen atoms from the interlayer insulating film. In addition, the first insulating film formed of the silicon nitride film itself had many hydrogen atoms. In the cover film even if there is a place at which the hydrogen concentration on a surface is low, by the hydrogen atoms that have penetrated the cover film and the hydrogen atoms in the first insulating film diffusing into the gate insulating film (tunnel insulating film), there is a risk that an electron trap amount in the gate insulating film will vary, and the threshold voltage Vt of the transistor will vary.

In the cover film described in Patent Document 3, a film formed by post-oxidation, by thermal oxidation, is used. However, since the post-oxidized film and the interlayer insulating film are of the same quality in the silicon oxide film, an effect of suppressing diffusion of the hydrogen atoms in the interlayer insulating film is small, and there is a risk that the hydrogen atoms in the interlayer insulating film will penetrate the cover film, and by the hydrogen atoms in the cover film diffusing into the gate insulating film (tunnel insulating film), the electron trap amount in the gate insulating film will vary, and the threshold voltage Vt of the transistor will vary.

It is a principal object of the present invention to suppress diffusion of hydrogen atoms to a memory cell from an interlayer insulating film, so as to improve reliability of operation of the memory cell.

In a first aspect of the present invention, there is provided a semiconductor memory device comprising a film which is coated with a first hydrogen storage film, the film being disposed on a surface of a silicon nitride film.

In the semiconductor memory device of the present invention, the film may be a cover film disposed, between a memory cell and an interlayer insulating film, which covers the memory cell.

In the semiconductor memory device of the present invention, the first hydrogen storage film may be a silicon nitride oxide film that includes $Si_2N_2O$.

In the semiconductor memory device of the present invention, hydrogen concentration of the first hydrogen storage film may be higher than $3 \times 10^{19}$ atom/cm$^3$.

In the semiconductor memory device of the present invention, the cover film may have a second hydrogen storage film on a bottom surface (opposite surface) of the silicon nitride film.

In the semiconductor memory device of the present invention, the second hydrogen storage film may be a silicon nitride oxide film that includes $Si_2N_2O$.

In the semiconductor memory device of the present invention, hydrogen concentration of the second hydrogen storage film may be higher than $3 \times 10^{19}$ atom/cm$^3$.

In the semiconductor memory device of the present invention, the first hydrogen storage film may have a hydrogen concentration higher than the silicon nitride film.

In the semiconductor memory device of the present invention, the second hydrogen storage film may have a hydrogen concentration higher than the silicon nitride film.

In a second aspect of the present invention, there is provided a method of manufacturing a semiconductor memory device comprising: forming a silicon nitride film on a memory cell, and forming a first silicon nitride oxide film including $Si_2N_2O$ by oxidizing a surface portion of the silicon nitride film.

The method of manufacturing the semiconductor memory device according to the present invention may further include forming a silicon oxide film formed from a silicon oxide film on a memory cell, and forming a second silicon nitride oxide film including $Si_2N_2O$ by nitriding the silicon oxide film, wherein the silicon nitride film is formed after forming the second silicon nitride oxide film.

The meritorious effects of the present invention are summarized as follows.

According to the present invention, the hydrogen storage layer has a function of absorbing hydrogen, and since the penetration of hydrogen atoms is very low, the hydrogen storage layer can block penetration of the hydrogen atoms to the silicon nitride film from the interlayer insulating film, and diffusion of the hydrogen atoms to the memory cell (gate insulating film, tunnel insulating film) from the silicon nitride film is prevented. As a result, by suppressing variations in hydrogen concentration in the gate insulating film, variations of the electron trap amount in the gate insulating film are suppressed, and it is possible to improve the reliability of operation of the device.

BRIEF DESCRIPTIONS OF THE DRAWINGS

PREFERRED MODES OF THE INVENTION

Figure 1A:
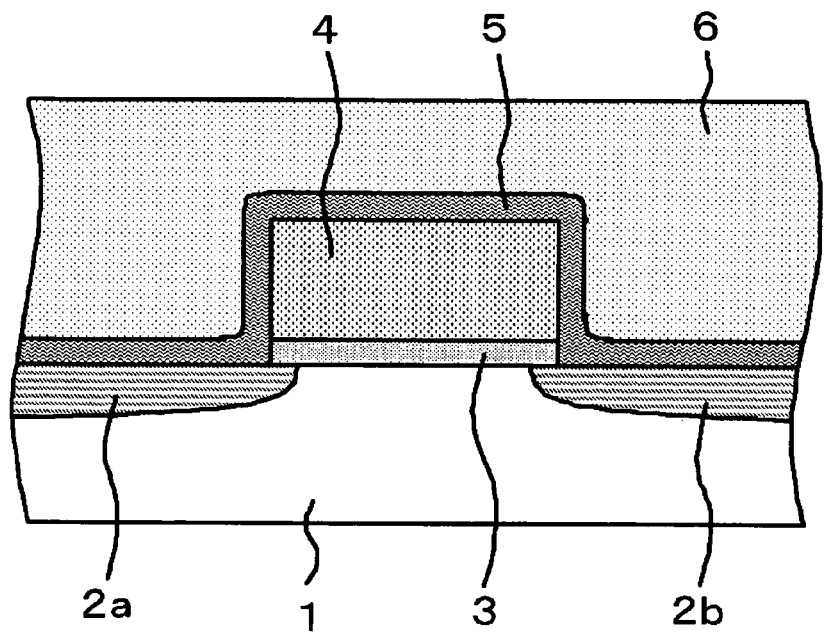
FIG. 1A is a partial cross sectional view schematically showing a configuration of a memory cell in a semiconductor memory device according to an exemplary embodiment 1 of the present invention.
Figure 1B:
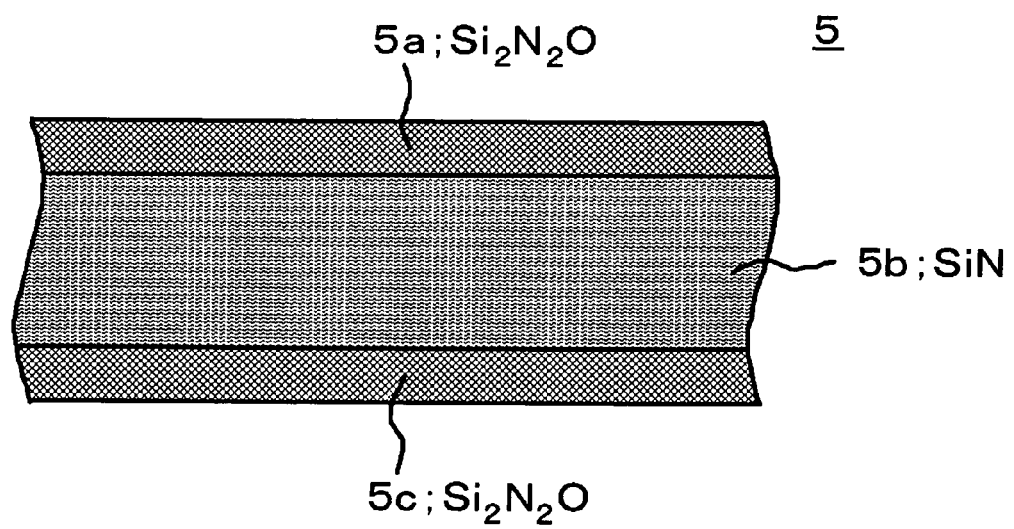
FIG. 1B is an enlarged sectional view of a cover film.

A semiconductor memory device according to an exemplary embodiment of the present invention is provided with a cover film (5 in FIG. 1A), disposed between a memory cell (gate electrode 4, and source and drain regions (diffusion regions) 2a and 2b in FIG. 1A) and an interlayer insulating film (6 in FIG. 1A), the cover film covering the memory cell, wherein the cover film (5 in FIG. 1B) has a hydrogen storage film (5a in FIG. 1B) that is a coating film on a surface of a silicon nitride film (5b in FIG. 1B). The hydrogen storage film (5a in FIG. 1B) is a silicon nitride oxide film that includes $Si_2N_2O$. The $Si_2N_2O$ represents a compound formed of Si, N, and O of an approximate relative proportions of 2:2:1.

Exemplary Embodiment 1

Figure 2:
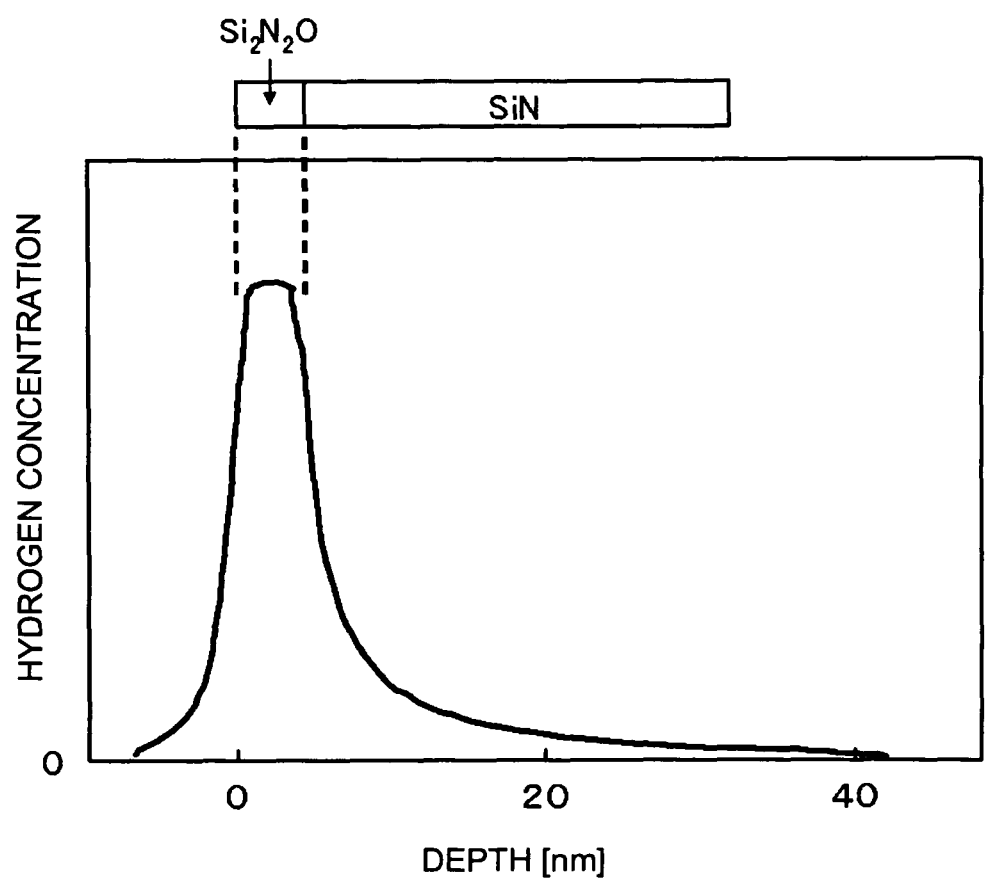
FIG. 2 is a graph showing a relationship of hydrogen concentration and depth of the cover film of the memory cell in the semiconductor memory device according to the exemplary embodiment 1 of the invention.

The semiconductor memory device according to an exemplary embodiment 1 of the present invention is described using the drawings. FIG. 1A is a partial cross sectional view schematically showing a configuration of the memory cell in the semiconductor memory device according to the exemplary embodiment 1 of the present invention, and FIG. 1B is an enlarged sectional view of a cover film. FIG. 2 is a graph showing a relationship of hydrogen concentration and depth of the cover film of the memory cell in the semiconductor memory device according to the exemplary embodiment 1 of the invention.

Referring to FIG. 1A, the memory cell in the semiconductor memory device according to the exemplary embodiment 1 has a source region 2a and a drain region 2b in which impurities (for example, phosphorus) are diffused on both sides of a channel in a silicon substrate 1 (for example, a P-type silicon substrate), and a gate electrode 4 (for example, polysilicon) is formed via a gate insulating film 3 (tunnel insulating film; for example, an ONO film (silicon oxide film/silicon nitride film/silicon oxide film) on the channel. The whole memory cell including the gate electrode 4 and the source and drain regions 2a and 2b is covered by the cover film 5, and an interlayer insulating film 6 (for example, a silicon oxide film) is formed on the cover film 5. The gate electrode 4 is electrically connected to a word line (not shown in the drawings) through a via or wiring. The drain region 2b is electrically connected to a bit line (not shown in the drawings) through a via or wiring, and the source region 2a is electrically connected to a source line through a via or wiring. A transistor configuration of the memory cell shown in FIG. 1A is one example; a configuration having a floating gate is possible, and the presence of a capacitor is also possible.

Referring to FIG. 1B, the cover film 5 is an insulating film that lies between the memory cell (the gate electrode 4 and the source and drain regions 2a and 2b) and the interlayer insulating film 6, and covers the entirety of the memory cell. The cover film 5 is built up in layers, in order, from a lower layer side, of a hydrogen storage film 5c, a silicon nitride film 5b, and a hydrogen storage film 5a. The hydrogen concentration of the cover film 5 has a steep concentration gradient which drops suddenly in accordance with separation from the hydrogen storage films 5a and 5c. In FIG. 2, if attention is focused on the hydrogen storage film 5a, depth represents distance from an upper edge of the cover film 5, and if attention is focused on the hydrogen storage film 5c, depth represents distance from a lower edge of the cover film 5.

The hydrogen storage film 5a is a film that stores hydrogen atoms. The hydrogen storage film 5a contains (i.e., can store) more hydrogen atoms than the silicon nitride film 5b. In the hydrogen storage film 5a the hydrogen concentration can be increased by heating. The hydrogen storage film 5a has a function of blocking hydrogen from the interlayer insulating film 6, by storing hydrogen atoms, and is such that hydrogen atoms are not passed to the silicon nitride film 5b side. Preferably, the film thickness of the hydrogen storage film 5a is greater than or equal to 0.3 nm and less than or equal to 10 nm. The hydrogen storage film 5a is a silicon nitride oxide film that includes $Si_2N_2O$, and the hydrogen concentration within this film preferably exceeds $3\times10^{19}$ atom/$cm^3$ (more preferably $8\times10^{19}$ atom/$cm^3$).

The silicon nitride film 5b may be a film that is formed by a CVD (Chemical Vapor Deposition) method, with silane and ammonia as raw material gases. With regard to the hydrogen concentration of the silicon nitride film 5b, the hydrogen atoms are absorbed into the hydrogen storage film 5a and the hydrogen storage film 5c, so that the hydrogen concentration in the silicon nitride film 5b is lower than that of the hydrogen storage film 5a and the hydrogen storage film 5c.

The hydrogen storage film 5c is a film that stores hydrogen atoms. The hydrogen storage film 5c contains (can absorb) more hydrogen atoms than the silicon nitride film 5b. In the hydrogen storage film 5c the hydrogen concentration can be increased by heating. The hydrogen storage film 5c stores hydrogen atoms of the silicon nitride film 5b, has a function of blocking hydrogen atoms from the silicon nitride film 5b, and is such that hydrogen is not passed to the gate insulating film 3 side. Preferably, the film thickness of the hydrogen storage film 5c is substantially greater than or equal to 0.3 nm and less than or equal to 10 nm. The hydrogen storage film 5c is a silicon nitride oxide film that includes $Si_2N_2O$, and the hydrogen concentration within this film preferably exceeds $3\times10^{19}$ atom/$cm^3$ (more preferably $8\times10^{19}$ atom/$cm^3$). If absorption (ability) of the hydrogen atoms of the silicon nitride film 5b is sufficient, e.g., by making the film thickness of the hydrogen storage film 5a on the upper layer side thick, it is possible to omit the hydrogen storage film 5c.

With regard to a method of manufacturing the hydrogen storage film 5a (the silicon nitride oxide film including the $Si_2N_2O$), it is possible to obtain the hydrogen storage film 5a by oxidizing the surface portion of the silicon nitride film 5b, for instance, by an ($N_2+O_2$) annealing method, an $O_3$ oxidation method, a dry oxidation method, or an ISSG (In Situ Steam Generated) oxidation method. The temperature when performing oxidation may be 900 degrees centigrade to 1050 degrees centigrade (in cases of $O_3$ oxidation, 400 degrees centigrade to 1050 degrees centigrade). The pressure when performing oxidation may be a few torr or greater.

With regard to a method of manufacturing the hydrogen storage film 5c (the silicon nitride oxide film including the $Si_2N_2O$), a silicon oxide film (not shown in the drawings) is formed by thermal oxidation, natural oxidation, or the like, on the surface of the memory cell that includes the gate electrode 4 and the source and drain regions (diffusion regions) 2a and 2b. The oxidation may be carried out, for instance, by annealing using $NH_3$ gas, at 400 degrees centigrade to 1050 degrees centigrade, and e.g., one atmospheric pressure or more, or by heat treatment using a precursor (for example, $NH_3$, $N_2O$) that includes a nitrogen component, at 400 degrees centigrade to 1050 degrees centigrade, and one atmospheric pressure or more, it is possible to obtain the hydrogen storage film 5c. After forming the hydrogen storage film 5c in this way, by forming the silicon nitride film 5b, and furthermore by forming the hydrogen storage film 5a as described previously, it is possible to obtain the cover film 5 formed of 3 layers as shown in FIG. 1B.

The inventors of the invention in the present application found by experiment that the hydrogen storage films 5a and 5c are formed of silicon nitride oxide films that include $Si_2N_2O$. In addition, the inventors of the present invention found by experiment that the $Si_2N_2O$ has a function of storing the hydrogen atoms, and that the penetration of the hydrogen atoms is very low.

Here, the silicon oxy-nitride described in Patent Document 1 is one that is deposited by a plasma-enhanced chemical vapor deposition (PECVD) process using silane as a reactant gas; the concentration of the free hydrogen in the silicon oxy-nitride is low. However, it is difficult to completely block the hydrogen from the interlayer insulating film. In addition, in the first insulating film (silicon nitride film) described in Patent Document 2, a surface oxide film (construed as SiON) is formed on a surface; there is a concentration gradient such that the hydrogen concentration gradually increases from this surface side, and the hydrogen concentration in this film is approximately $1.6\times10^{21}$ atom/$cm^3$, however it is difficult to completely block the hydrogen from the interlayer insulating film.

On the other hand, the hydrogen storage films 5a and 5c of the exemplary embodiment 1 are silicon nitride oxide films that include $Si_2N_2O$, and the hydrogen concentration in these films exceeds $3\times10^{19}$ atom/$cm^3$. In cases of heating to 700 degrees centigrade or above, the hydrogen atoms in $SiO_2$ and $Si_3N_4$ are expelled, but the $Si_2N_2O$ absorbs the hydrogen, and the $Si_2N_2O$ blocks the hydrogen from the interlayer insulating film 6. With the silicon oxy-nitride described in Patent Document 1 or the surface oxide film described in Patent Document 2, this type of hydrogen storage is not present and Patent Document 1 is understood to be different from the hydrogen storage films 5a and 5c (silicon nitride oxide films that include $Si_2N_2O$) of the exemplary embodiment 1.

According to the exemplary embodiment 1, the hydrogen storage layer 5a has a function of absorbing hydrogen, and since the penetration of hydrogen atoms is very low, the hydrogen storage layer 5a can block penetration of the hydrogen atoms to the silicon nitride film 5b from the interlayer insulating film 6, and diffusion of the hydrogen atoms into the gate insulating film 3 (the tunnel insulating film) from the silicon nitride film 5b is prevented. As a result, variations in hydrogen concentration in the gate insulating film 3 are suppressed, and variations in the electron trap amount in the gate insulating film 3 are suppressed, so that it is possible to improve the reliability of operation of a device.

In addition, since the hydrogen storage film 5c has a function of absorbing the hydrogen, and the penetration of the hydrogen atoms is very low, it is possible to block penetration of the hydrogen atoms to the gate insulating film 3 (the tunnel insulating film) from the silicon nitride film 5b. As a result, variations in hydrogen concentration in the gate insulating film 3 are suppressed, and variations of the electron trap amount in the gate insulating film 3 are suppressed, so that it is possible to improve the reliability of operation of a device.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device, comprising:
a cover film, said cover film comprising:
a silicon nitride layer;
a first hydrogen storage film disposed directly on a top surface of said silicon nitride film; and
a second hydrogen storage film disposed directly on a bottom surface of said silicon nitride film;
a memory cell, said second hydrogen storage film being disposed on a surface of said memory cell; and
an interlayer insulating film disposed on an upper surface of the first hydrogen storage film and extending in a stacking direction of the semiconductor memory device to cover side surfaces of the memory cell,
wherein said memory cell comprises a source and a drain, and
wherein said cover film is disposed on an upper surface of said source and said drain
wherein said memory cell further comprises a gate electrode and a gate insulating film disposed on a bottom surface of said gate electrode, and wherein a bottom surface of the gate insulating film is disposed on the upper surface of said source and said drain,
wherein a bottom surface of the second hydrogen storage film abuts the upper surface of said source and said drain.

2. The semiconductor memory device according to claim 1, wherein said cover film is disposed between said memory cell and an interlayer insulating film.

3. The semiconductor memory device according to claim 2, wherein said cover film is disposed directly on said memory cell.

4. The semiconductor memory device according to claim 1, wherein said first hydrogen storage film comprises a silicon nitride oxide film that includes $Si_2N_2O$.

5. The semiconductor memory device according to claim 1, wherein hydrogen concentration of said first hydrogen storage film is higher than $3 \times 10^{19}$ atom/cm$^3$.

6. The semiconductor memory device according to claim 1, wherein said second hydrogen storage film comprises a silicon nitride oxide film that includes $Si_2N_2O$.

7. The semiconductor memory device according to claim 1, wherein hydrogen concentration of said second hydrogen storage film is higher than $3 \times 10^{19}$ atom/cm$^3$.

8. The semiconductor memory device according to claim 1, wherein said first hydrogen storage film has a hydrogen concentration higher than said silicon nitride film.

9. The semiconductor memory device according to claim 1, wherein said second hydrogen storage film has a hydrogen concentration higher than said silicon nitride film.

10. The semiconductor memory device according to claim 1, wherein the interlayer insulating film is disposed above said memory cell, and wherein said cover film is disposed between said memory cell and the interlayer insulating film.

11. The semiconductor memory device according to claim 1, wherein said second hydrogen storage film abuts an upper surface and the side surfaces of said memory cell.

12. The semiconductor memory device according to claim 11, wherein the at least one interlayer insulating film abuts the upper surface and side surfaces of the first hydrogen storage film.

13. The semiconductor memory device according to claim 1, wherein the gate insulating film abuts the second hydrogen storage film and the upper surface of said source and said drain.

14. A semiconductor memory device, comprising:
a memory cell;
at least one interlayer insulating film disposed above said memory cell and extending
in a stacking direction of the semiconductor memory device to cover side surfaces of the memory cell; and
a cover film disposed between said memory cell and said at least one interlayer insulating film, said cover film comprising:
a silicon nitride film;
a first hydrogen storage film disposed directly on a surface of said silicon nitride film; and
a second hydrogen storage film disposed directly on another surface of said silicon nitride film, wherein said second hydrogen storage film is disposed on a surface of said memory cell,
wherein said memory cell comprises a source and a drain, and
wherein said cover film is disposed on an upper surface of said source and said drain,
wherein said memory cell further comprises a gate electrode, and
wherein said cover film covers and is disposed directly on said gate electrode, said source, and said drain.

15. The semiconductor memory device according to claim 14, wherein said cover film separates said memory cell from each of said at least one interlayer insulating film.

16. The semiconductor memory device according to claim 14, wherein said second hydrogen storage film abuts an upper surface and said side surfaces of said memory cell.

17. The semiconductor memory device according to claim 16, wherein the at least one interlayer insulating film abuts an upper surface and side surfaces of the first hydrogen storage film.

* * * * *